(12) United States Patent
Flachowsky et al.

(10) Patent No.: US 8,963,208 B2
(45) Date of Patent: Feb. 24, 2015

(54) SEMICONDUCTOR STRUCTURE INCLUDING A SEMICONDUCTOR-ON-INSULATOR REGION AND A BULK REGION, AND METHOD FOR THE FORMATION THEREOF

(71) Applicant: GLOBALFOUNDRIES Inc., Grand Cayman (KY)

(72) Inventors: Stefan Flachowsky, Dresden (DE); Matthias Kessler, Dresden (DE); Jan Hoentschel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 121 days.

(21) Appl. No.: 13/678,054

(22) Filed: Nov. 15, 2012

(65) Prior Publication Data

US 2014/0131771 A1  May 15, 2014

(51) Int. Cl.
| | |
|---|---|
| *H01L 21/00* | (2006.01) |
| *H01L 21/02* | (2006.01) |
| *H01L 21/8238* | (2006.01) |
| *H01L 21/84* | (2006.01) |
| *H01L 21/762* | (2006.01) |
| *H01L 29/66* | (2006.01) |
| *H01L 27/12* | (2006.01) |
| *H01L 27/06* | (2006.01) |
| *H01L 29/94* | (2006.01) |
| *H01L 27/088* | (2006.01) |

(52) U.S. Cl.
CPC .. *H01L 21/02428* (2013.01); *H01L 21/823878* (2013.01); *H01L 21/84* (2013.01); *H01L 21/76283* (2013.01); *H01L 29/66181* (2013.01); *H01L 27/1207* (2013.01); *H01L 27/0629* (2013.01); *H01L 29/945* (2013.01); *H01L 27/088* (2013.01)
USPC .............................. 257/194; 257/368; 257/347

(58) Field of Classification Search
USPC ........................................ 257/194, 368, 347
See application file for complete search history.

(56) References Cited

U.S. PATENT DOCUMENTS

| | | | | |
|---|---|---|---|---|
| 6,429,488 B2 * | 8/2002 | Leobandung et al. | ......... | 257/354 |
| 7,274,072 B2 * | 9/2007 | Chang et al. | .................. | 257/368 |

* cited by examiner

*Primary Examiner* — Laura Menz
(74) *Attorney, Agent, or Firm* — Amerson Law Firm, PLLC

(57) ABSTRACT

A structure comprises a semiconductor substrate, a semiconductor-on-insulator region and a bulk region. The semiconductor-on-insulator region comprises a first semiconductor region, a dielectric layer provided between the semiconductor substrate and the first semiconductor region, and a first transistor comprising an active region provided in the first semiconductor region. The dielectric layer provides electrical isolation between the first semiconductor region and the semiconductor substrate. The bulk region comprises a second semiconductor region provided directly on the semiconductor substrate.

10 Claims, 12 Drawing Sheets

SEMICONDUCTOR STRUCTURE INCLUDING A SEMICONDUCTOR-ON-INSULATOR REGION AND A BULK REGION, AND METHOD FOR THE FORMATION THEREOF

BACKGROUND OF THE INVENTION

1. Field of the Invention

Generally, the present disclosure relates to the field of integrated circuits, and, more particularly, to integrated circuits wherein semiconductor-on-insulator techniques are employed.

2. Description of the Related Art

Integrated circuits typically include a large number of circuit elements, which include, in particular, field effect transistors. In a field effect transistor, a gate electrode may be separated from a channel region by a gate insulation layer that provides an electrical insulation between the gate electrode and the channel region. Adjacent the channel region, a source region and a drain region are provided.

The channel region, the source region and the drain region may be formed in a semiconductor material, wherein the doping of the channel region is different from the doping of the source region and the drain region. Depending on an electric voltage applied to the gate electrode, the field effect transistor may be switched between an on-state, wherein there is a relatively high electrical conductance between the source region and the drain region, and an off-state, wherein there is a relatively low electrical conductance between the source region and the drain region.

For improving the performance of integrated circuits including field effect transistors, it has been proposed to employ semiconductor-on-insulator technology. In semiconductor-on-insulator technology, a semiconductor-on-insulator structure is provided. The semiconductor-on-insulator structure includes a thin layer of a semiconductor material, for example silicon, that is provided above a substrate of a semiconductor material, for example silicon. The layer of semiconductor material is separated from the substrate by a layer of an electrically insulating material, for example silicon dioxide. Compared to integrated circuits wherein field effect transistors are formed on a bulk semiconductor substrate, semiconductor-on-insulator technology allows reducing parasitic capacitances and leakage currents. Moreover, integrated circuits formed in accordance with semiconductor-on-insulator technology may be less sensitive with respect to ionizing radiation.

However, semiconductor-on-insulator technology has some specific issues associated therewith, which include the so-called floating body effect. The body of a field effect transistor forms a capacitor with the insulated substrate. In this capacitor, electric charge can accumulate and cause adverse effects, which may include a dependence of the threshold voltage of the field effect transistor on its previous states.

For substantially avoiding the floating body effect, it has been proposed to use fully depleted field effect transistors. Fully depleted field effect transistors are formed using a semiconductor-on-insulator structure wherein the semiconductor layer provided on the insulator layer has a smaller thickness than a channel depletion width of the field effect transistor. Thus, the electric charge and, accordingly, the body potential of the field effect transistor are fixed.

However, fully depleted field effect transistors may be less suitable for some applications, including the processing of input to a digital integrated circuit and output from a digital integrated circuit. For such applications, field effect transistors formed on a bulk substrate may provide more appropriate device characteristics. Moreover, field effect transistors formed on a bulk semiconductor substrate may be of advantage when used in analog integrated circuits.

In view of the situation described above, the present disclosure relates to a structure and a method for the formation thereof that allow using the advantages of semiconductor-on-insulator structures in parallel with devices that may benefit from a bulk semiconductor substrate.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative structure disclosed herein includes a semiconductor substrate, a semiconductor-on-insulator region and a bulk region. The semiconductor-on-insulator region includes a first semiconductor region, a dielectric layer provided between the semiconductor substrate and the first semiconductor region, and a first transistor. The first transistor includes an active region provided in the first semiconductor region. The dielectric layer provides electrical isolation between the first semiconductor region and the semiconductor substrate. The bulk region includes a second semiconductor region provided directly on the semiconductor substrate.

An illustrative method disclosed herein includes providing a structure including a semiconductor substrate, a semiconductor layer provided above the semiconductor substrate and a dielectric layer provided between the semiconductor substrate and the semiconductor layer. Portions of the semiconductor layer and the dielectric layer in a first part of the structure are removed. Thus, the semiconductor substrate is exposed in the first part of the structure. Portions of the dielectric layer and the semiconductor layer in a second part of the structure remain on the semiconductor substrate. In the first part of the structure, a semiconductor region is formed directly on the exposed semiconductor substrate. In the second part of the structure, a first transistor is formed. The first transistor includes an active region provided in the portion of the semiconductor layer in the second part of the structure.

BRIEF DESCRIPTION OF THE DRAWINGS

The disclosure may be understood by reference to the following description taken in conjunction with the accompanying drawings, in which like reference numerals identify like elements, and in which.

Figure 1A:
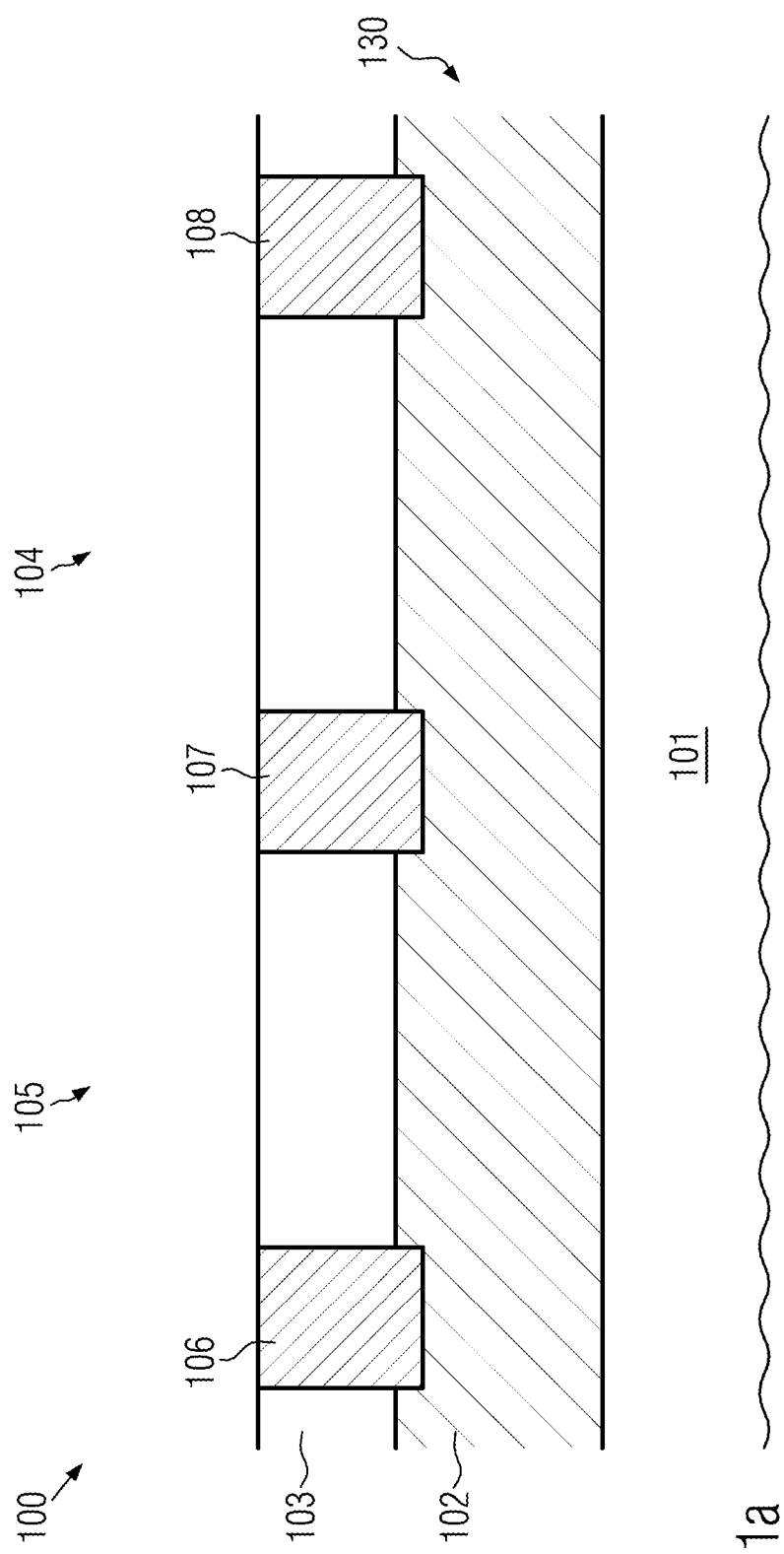
FIGS. 1a-1e show schematic cross-sectional views of a structure according to an illustrative embodiment during stages of a method according to an illustrative embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

The present disclosure provides structures wherein a semiconductor-on-insulator region and a bulk region are provided on a same semiconductor substrate. In the semiconductor-on-insulator region, a field effect transistor, which may, in some embodiments, be a fully depleted field effect transistor, may be provided. Electrical circuits including field effect transistors provided in the semiconductor-on-insulator region may be used in combination with devices that benefit from a bulk architecture and are formed in the bulk region. Such devices may be input/output devices, diodes and/or capacitance structures. Thus, chips, wherein different device groups may be combined locally close to each other on a same semiconductor structure, which may, for example, include an integral semiconductor die, may be provided, allowing the formation of circuits having a greater density of integration and a higher performance.

In embodiments of a method for the formation of such a structure, a semiconductor-on-insulator substrate is used as a starting material. The semiconductor-on-insulator substrate may include a semiconductor layer that has a thickness adapted for the formation of fully depleted field effect transistors and is provided on a dielectric layer provided on a semiconductor substrate. After the formation of a trench isolation structure, that may be a shallow trench isolation, for electrically separating the different device groups, the semiconductor layer is removed in parts of the semiconductor substrate by means of an etch process, for example, an anisotropic etch process. Further etching removes the dielectric layer until the semiconductor substrate is exposed. Thereafter, an epitaxy step may be performed to grow semiconductor material from the semiconductor substrate up to the level of the original semiconductor layer. Now there exists a semiconductor-on-insulator region that may be used for high performance devices which, however, may have greater leakage currents, while high voltage devices and special non-transistor devices such as, for example, diodes and capacitances may be fabricated on bulk semiconductor material. Further process steps for the formation of such devices may be performed in accordance with known techniques for the manufacturing of field effect transistors. In particular, a conventional high-k metal gate process may be employed.

Other embodiments may involve only partially re-growing the bulk region and completing the refill with a growth of at least one other semiconductor material, for example, silicon/germanium, germanium or a III-V semiconductor material such as gallium arsenide. This may enable the usage of high frequency analog devices or high mobility devices on a same chip where conventional logic circuits are implemented.

FIG. 1a shows a schematic cross-sectional view of a semiconductor structure 100 in a first stage of a manufacturing process according to an embodiment. The semiconductor structure 100 includes a semiconductor-on-insulator structure 130. The semiconductor-on-insulator structure 130 includes a substrate 101 that may include a semiconductor material such as, for example, silicon. On the substrate 101, a dielectric layer 102 is provided. The dielectric layer 102 includes an electrically insulating material such as, for example, silicon dioxide. On the dielectric layer 102, a semiconductor layer 103 is provided. Thus, the dielectric layer 102 is arranged between the semiconductor layer 103 and the substrate 101, and may provide electrical insulation between the semiconductor layer 103 and the substrate 101.

The semiconductor layer 103 may include the same semiconductor material as the substrate 101. For example, the semiconductor layer 103 may include silicon. In other embodiments, the semiconductor layer 103 may be formed of a different semiconductor material than the substrate 101. For example, the substrate 101 may include silicon, and the semiconductor layer 103 may include silicon/germanium, silicon carbide, germanium or a III-V semiconductor material such as gallium arsenide. In further embodiments, both the semiconductor layer 103 and the substrate 101 may include a semiconductor material other than silicon.

In embodiments, the semiconductor-on-insulator structure 130 may be adapted for the formation of fully depleted field effect transistors having an active region provided in the semiconductor layer 103. For this purpose, the semiconductor layer 103 may have a thickness in a range from about 5-10 nm, and the dielectric layer 102 may have a thickness in a range from about 8-15 nm.

The semiconductor-on-insulator structure 130 may be formed in accordance with known techniques for the formation of semiconductor-on-insulator structures. In embodiments, a first semiconductor wafer including the semiconductor material of the substrate 101 and a second semiconductor wafer including the material of the semiconductor layer 103 are provided, wherein at least one of the wafers has a layer of the material of the dielectric layer 102 formed thereon. The wafers are brought into contact with each other so that the layer of dielectric material is between the semiconductor materials of the wafers, and the wafers are bonded to each other. Then, the wafer including the material of the semiconductor layer 103 is cleaved, for example, at a location wherein hydrogen has been implanted before bonding the wafers, and a polishing process, for example, a chemical mechanical polishing process, may be performed to provide a smooth surface of the semiconductor layer 103.

Trench isolation structures 106, 107, 108 may be formed. In embodiments, the trench isolation structures 106, 107, 108 may be shallow trench isolations. The trench isolation structures 106, 107, 108 may extend through the semiconductor layer 103 into the dielectric layer 102, so that portions of the semiconductor layer 103 enclosed by one or more of the trench isolation structures 106, 107, 108 are electrically insulated from other portions of the semiconductor layer 103 by the trench isolation structures 106, 107, 108 and the dielectric layer 102. The trench isolation structures 106, 107, 108 may be formed by means of techniques including photolithography, etching, oxidation and deposition. In embodiments, the trench isolation structures 106, 107, 108 may include an electrically insulating material, such as silicon dioxide.

Figure 1B:
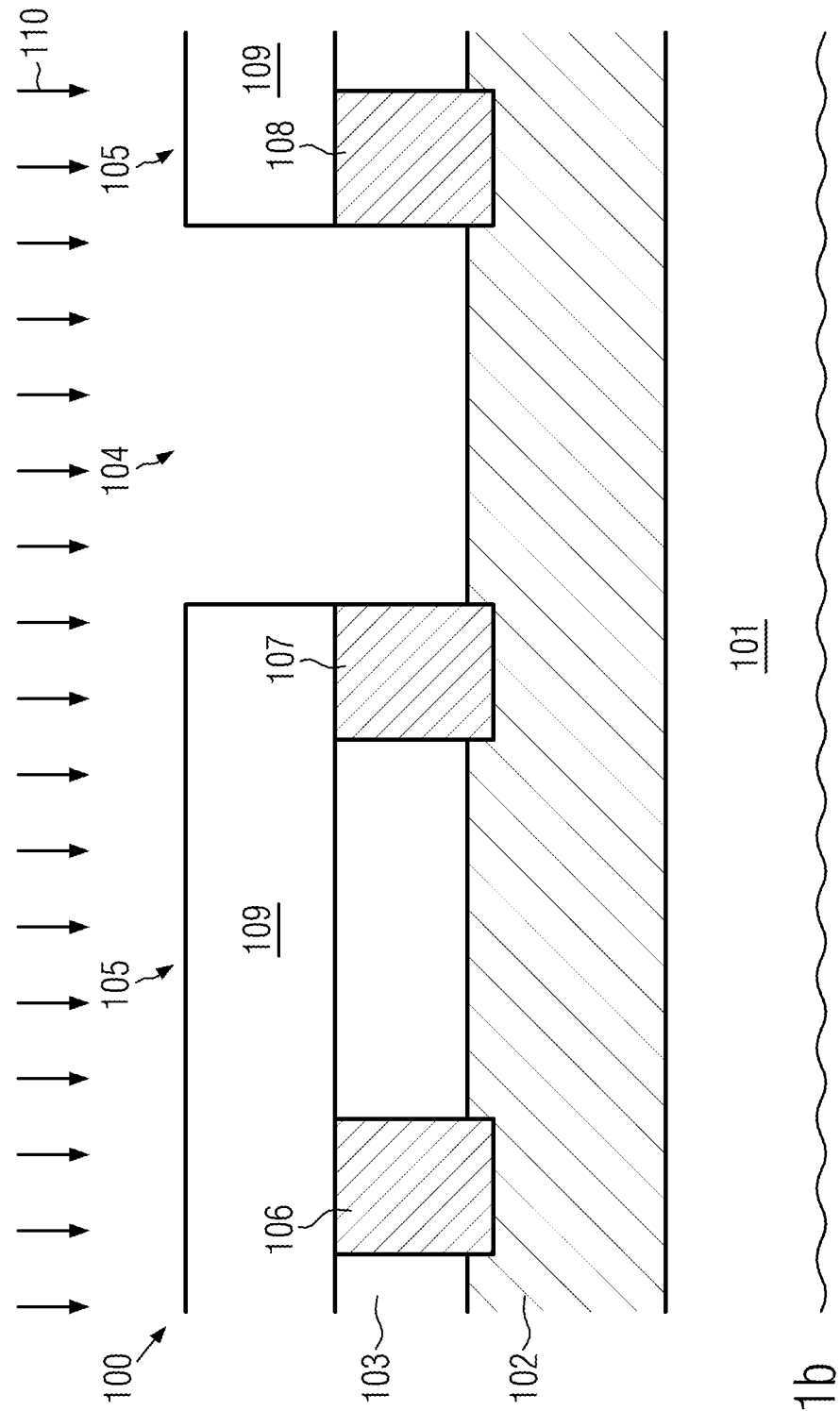

FIG. 1b shows a schematic cross-sectional view of the semiconductor structure 100 in a later stage of the manufacturing process. A mask 109 is formed above the semiconductor structure 100. In embodiments, the mask 109 may be a hardmask. The mask 109 covers a part 105 of the semiconductor structure 100. The part 105 of the semiconductor structure 100 includes an area between the trench isolation structures 106, 107 and areas adjacent the trench isolation structures 106, 108. Additionally, the mask 109 may cover the trench isolation structures 106, 107, 108 or portions thereof.

A part 104 of the semiconductor structure 100 is not covered by the mask 109. The part 104 of the semiconductor structure 100 may include an area between the trench isolation structures 107, 108.

In embodiments wherein the mask 109 is a hardmask, the mask 109 may be formed by depositing a layer of the material of the mask 109 on the semiconductor structure 100 and removing a portion of the layer in the part 104 of the semiconductor structure 100, so that a portion of the semiconductor layer 103 in the part 104 of the semiconductor structure 100 is exposed. This may be done by means of processes of photolithography and etching.

After the formation of the mask 109, an etch process adapted to selectively remove the material of the semiconductor layer 103 relative to the material of the mask 109 may be performed, as denoted by arrows 110 in FIG. 1b. The etch process 110 may be an anisotropic dry etch process, for example, a reactive ion etch process.

For providing the selectivity of the etch process, the etch process 110 may be adapted such that the material of the mask 109 is affected by the etch process 110 to a less extent than the material of the semiconductor layer 103, or is substantially not affected by the etch process 110 at all, so that the mask 109 remains substantially intact. The etch process 110 may be stopped as soon as the dielectric layer 102 is exposed in the part 104 of the semiconductor structure 100.

Figure 1C:
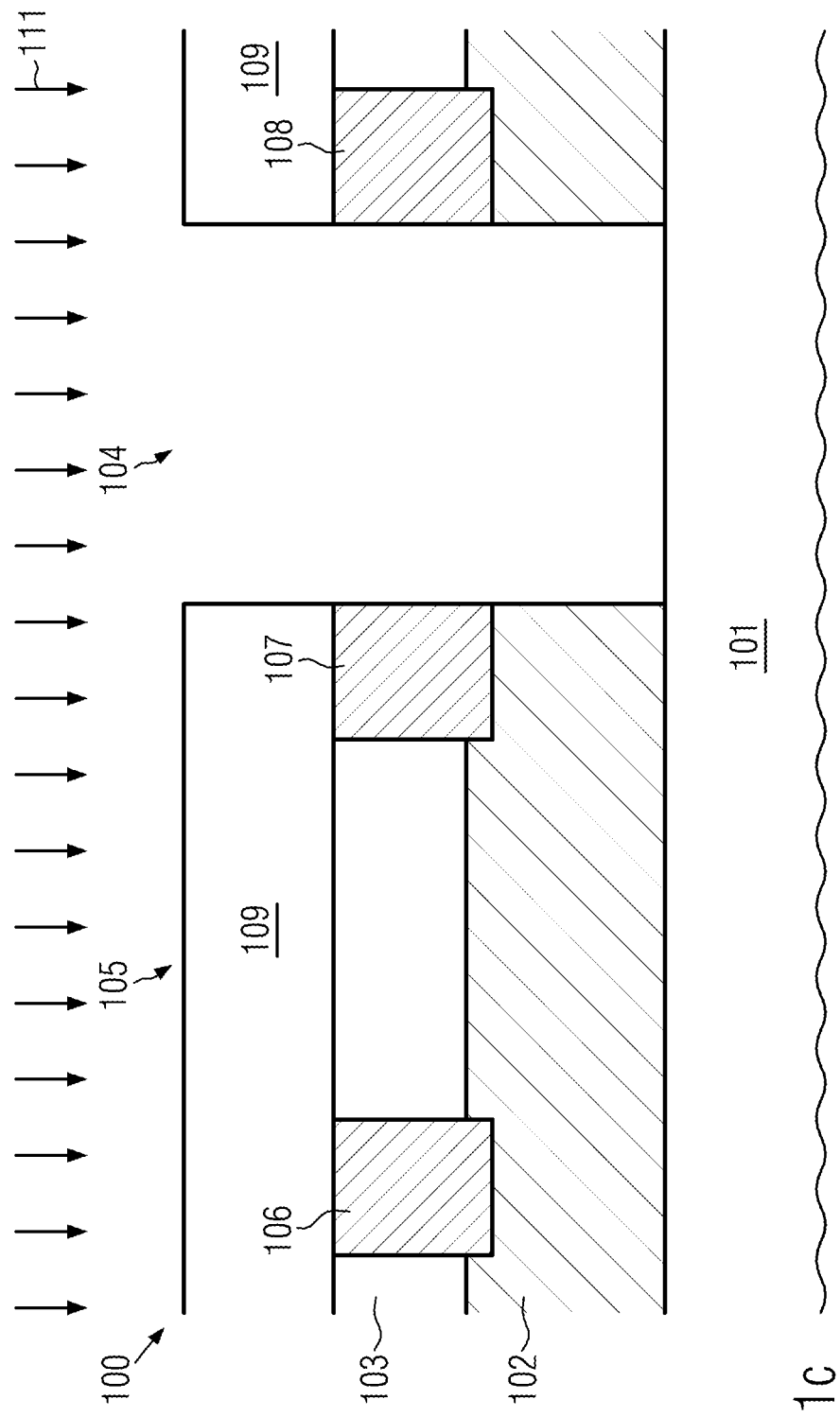

FIG. 1c shows a schematic cross-sectional view of the semiconductor structure 100 in a later stage of the manufacturing process. After removing portions of the semiconductor layer 103 in the part 104 of the semiconductor structure 100, an etch process adapted for removing the material of the dielectric layer 102 may be performed, as denoted by arrows 111 in FIG. 1c. The etch process 111 may be an anisotropic dry etch process, for example, a reactive ion etch process. The etch process 111 may be adapted to selectively remove the material of the dielectric layer 102 with respect to the material of the mask 109, so that the mask 109 is not affected by the etch process 111 or affected by the etch process 111 to a low extent and remains substantially intact. The etch process 111 may be performed until the substrate 101 is exposed in the part 104 of the semiconductor structure 100.

During the etch processes 110, 111, portions of the dielectric layer 102 and the semiconductor layer 103 in the part 105 of the semiconductor structure 100, as well as the trench isolations 106, 107, 108, are protected by the mask 109 and, thus, remain on the substrate 100.

In embodiments wherein the dielectric layer 102 includes silicon dioxide, the mask 109 may be formed of silicon nitride or silicon oxynitride. The portion of the semiconductor layer 103 in the part 104 of the semiconductor structure 100 may be removed by means of an etch process 110 that is adapted for selectively removing the semiconductor material of the semiconductor layer 103 relative to silicon nitride or silicon oxynitride, respectively. The portion of the dielectric layer 102 in the part 104 of the semiconductor structure 100 may be removed by means of an etch process 111 that is adapted for selectively removing silicon dioxide with respect to silicon nitride or silicon oxynitride, respectively.

Figure 1D:
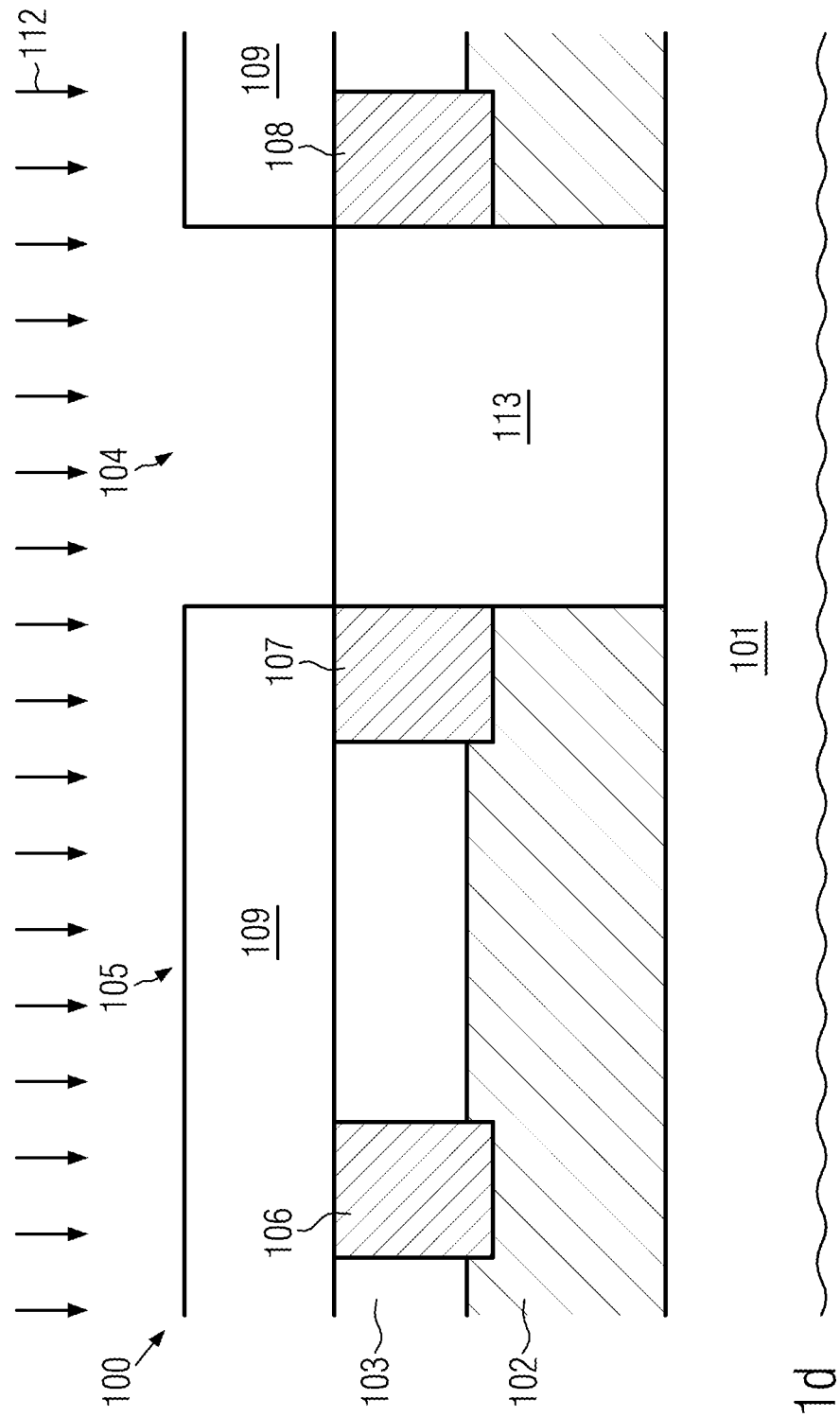

FIG. 1d shows a schematic cross-sectional view of the semiconductor structure 100 in a later stage of the manufacturing process. After removing portions of the semiconductor layer 103 and the dielectric layer 102 in the part 104 of the semiconductor structure 100, a semiconductor region 113 may be formed directly on the exposed substrate 101 in the part 104 of the semiconductor structure 100. In some embodiments, the semiconductor region 113 may be formed of substantially the same semiconductor material as the substrate 101. For example, in embodiments wherein the substrate 101 includes silicon, the semiconductor region 113 may also include silicon. In other embodiments, the semiconductor region 113 or portions thereof may include a different semiconductor material than the material of the substrate 101. Embodiments wherein the semiconductor region 113 includes a different semiconductor material than the substrate 101 will be described in more detail below.

Since the semiconductor region 113 is formed directly on the substrate 101, the semiconductor region 113 is not electrically insulated from the substrate 101 by a dielectric layer. Hence, while the semiconductor layer 103 and the dielectric layer 102 in the part 105 of the semiconductor structure 100 provide a semiconductor-on-insulator configuration, in the part 104 of the semiconductor structure 100, the semiconductor region 113 and the substrate 101 provide a bulk semiconductor configuration.

Thus, the semiconductor structure 100 includes a semiconductor-on-insulator region in the part 105 of the semiconductor structure 100 and a bulk region in the part 104 of the semiconductor structure 100. The semiconductor-on-insulator region includes a first semiconductor region, provided in the form of one or more portions of the semiconductor layer 103 in the part 105 of the semiconductor structure 100, and the semiconductor region 113 forms a second semiconductor region in the bulk region of the semiconductor structure.

In some embodiments, extensions of the semiconductor region 113 in directions parallel to an interface between the substrate 101 and the dielectric layer 102 and perpendicular to a thickness direction of the substrate 101 may be relatively small. For example, the extension of the semiconductor region 113 may correspond to the size of a single circuit element, such as a transistor, diode and/or capacitor to be formed in the semiconductor region 113.

In other embodiments, the extension of the semiconductor region 113 in directions parallel to the interface between the substrate 101 and the semiconductor layer 102 may be adapted such that a plurality of circuit elements, for example a DRAM memory cell, may be formed in the semiconductor region 113. In further embodiments, the extension of the semiconductor region 113 may be relatively large, so that an electric circuit such as, for example, an input/output portion of an integrated circuit, may be formed in the part 104 of the semiconductor structure 100.

The size and shape of the semiconductor region 113 correspond to the size and shape of the openings in the mask 109, which define the part 104 and the part 105 of the semiconductor structure 100.

The formation of the semiconductor region 113 in the part 104 in the semiconductor structure 100 may include a selective growth process, as schematically denoted by arrows 112 in FIG. 1d. In some embodiments, the selective growth process 112 may be a selective epitaxial growth process that is adapted to selectively deposit the semiconductor material of the semiconductor region 113 on the exposed portion of the substrate 101 in the part 104 of the semiconductor structure 100, whereas substantially no deposition of semiconductor material or only a deposition of a relatively small amount of semiconductor material occurs on the mask 109 in the part 105 of the semiconductor structure 100.

In embodiments wherein the substrate 101 and the semiconductor region 113 include silicon, and the mask 109 includes silicon nitride, silicon oxynitride or silicon dioxide, the selective epitaxial growth process may include a chemical vapor deposition process or plasma enhanced chemical vapor deposition process wherein a reactant gas including silicon and chlorine, such as $SiCl_4$, $SiHCl_3$ and/or $SiH_2Cl_2$, is used. Additionally, hydrogen chloride may be added to the reactant gas, or the reactant gas may include hydrogen chloride in combination with a reactant that includes silicon but does not include chlorine, such as $Si_2H_6$.

The chlorine in the reactant gas may react chemically with silicon atoms on the mask 109, wherein gaseous reaction products are created that may be removed. Silicon atoms on the exposed surface of the substrate 101 and/or on the surface of material of the semiconductor region 113 that has already been deposited in the part 104 of the semiconductor structure 100, which may be more strongly bound than silicon atoms on the surface of the mask 109, react with chlorine to a lower extent and thus can remain on the semiconductor structure 100.

In other embodiments, methods of selective epitaxial growth other than chemical vapor deposition or plasma enhanced chemical vapor deposition may be used, for example, molecular beam epitaxy or metal organic chemical vapor deposition. In particular, metal organic chemical vapor deposition may be employed in embodiments wherein the semiconductor region 113 comprises a III-V semiconductor material such as, for example, gallium arsenide.

In further embodiments, a non-selective growth process wherein the material of the semiconductor region 113 is deposited not only on the exposed substrate 101 in the part 104 of the semiconductor structure 100, but also on the mask 109, may be used for forming the semiconductor region 113, and the semiconductor material deposited on the mask 109 may be removed at a later point in time, as will be described below.

Figure 1E:
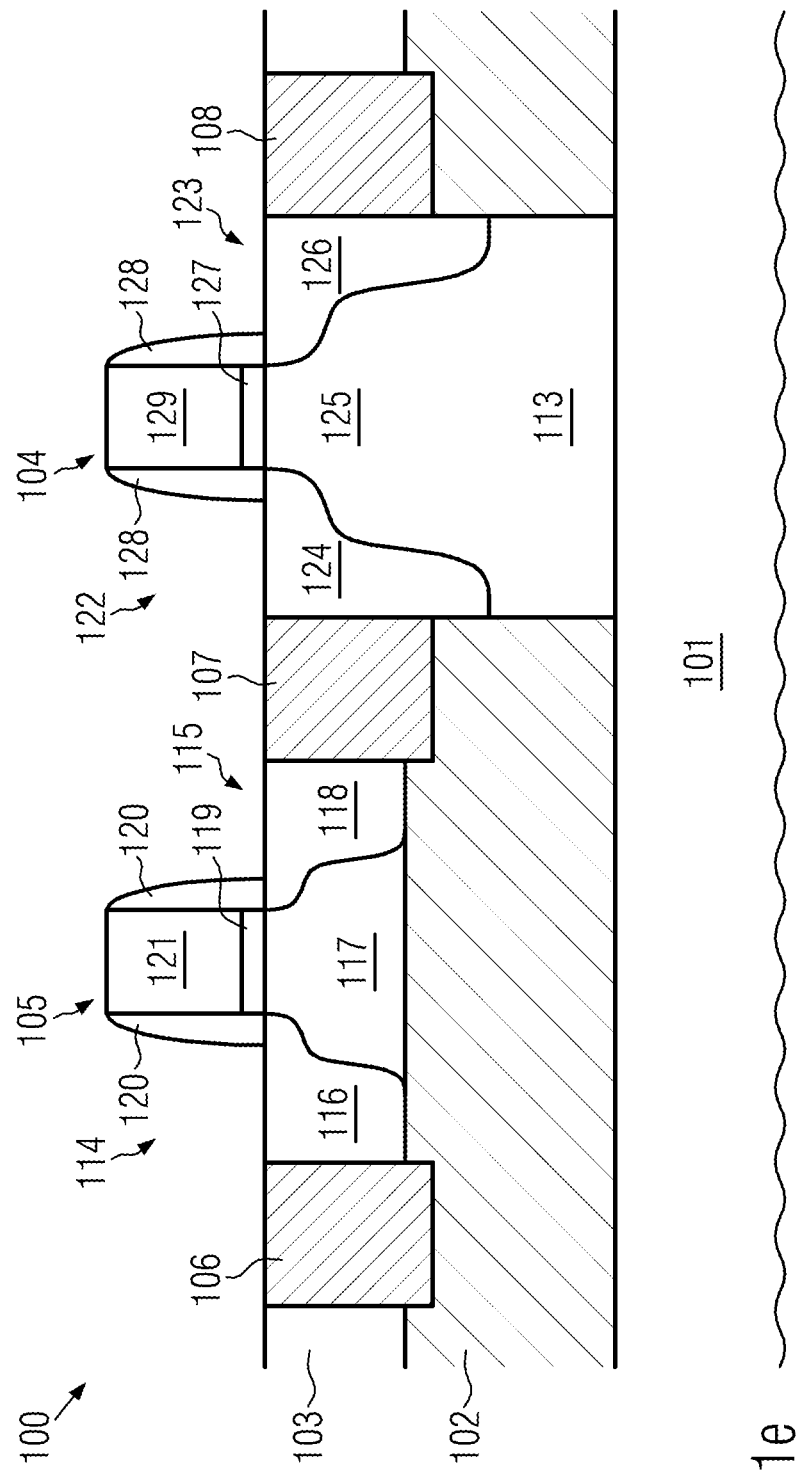

FIG. 1e shows a schematic cross-sectional view of the semiconductor structure 100 in a later stage of the manufacturing process. After the formation of the semiconductor region 113, the mask 109 may be removed. In some embodiments, the removal of the mask 109 may include an etch process that is adapted to selectively remove the material of the mask 109 with respect to the one or more semiconductor materials of the semiconductor layer 103 and the semiconductor region 113 and the material of the trench isolation structures 106, 107, 108. In embodiments wherein the semiconductor layer 103 and the semiconductor region 113 include silicon, the trench isolation structures 106, 107, 108 include silicon dioxide, and the mask 109 includes silicon nitride or silicon oxynitride, an etch process adapted for selectively removing silicon nitride or silicon oxynitride, respectively, relative to silicon and silicon dioxide may be used. After the etch process used for removing the mask 109, a planarization process, for example, a chemical mechanical polishing process, may be performed for smoothening the surface of the semiconductor structure 100.

In other embodiments, the etch process for removing the mask 109 may be omitted, and the mask 109 may be removed during the chemical mechanical polishing process. In such embodiments, the chemical mechanical polishing process may also remove semiconductor material deposited on the mask 109 in embodiments wherein the semiconductor region 113 is formed by means of a non-selective growth process.

In further embodiments, the mask 109 may be removed by means of an etch process, and the chemical mechanical polishing process may be omitted.

After the removal of the mask 109 and the optional planarization process, the semiconductor structure 100 may have a smooth, substantially planar surface. In particular, the surface of the semiconductor region 113 in the part 104 of the semiconductor structure 100 and the surface of the semiconductor layer 103 in the part 105 of the semiconductor structure 100 may substantially lie in a common plane. Thus, photolithography processes may be used for simultaneously forming structures in the parts 104, 105 of the semiconductor structure 100, even if photolithography tools having a small depth of focus are employed.

A field effect transistor 114 may be formed in the part 105 of the semiconductor structure 100, and a field effect transistor 122 may be formed in the part 104.

The field effect transistor 114 includes a gate electrode 121 separated from the semiconductor layer 103 by a gate insulation layer 119, a sidewall spacer 120 adjacent the gate electrode 121 and an active region 115 formed in the portion of the semiconductor layer 103 in the part 105 of the semiconductor structure 100. The active region 115 includes a channel region 117 below the gate electrode 121, as well as a source region 116 and a drain region 118 adjacent the channel region 117.

The field effect transistor 122 includes a gate electrode 129 formed above the semiconductor region 113 and separated therefrom by a gate insulation layer 127, a sidewall spacer 128 adjacent the gate electrode 129, and an active region 123 formed in the semiconductor region 113. The active region 123 includes a channel region 125 below the gate electrode 129, as well as a source region 124 and a drain region 126 adjacent the channel region 125.

The field effect transistors 114, 122 may be formed by means of known processes for the formation of field effect transistors, including deposition, photolithography, etching and/or ion implantation.

The active region 115 of the field effect transistor 114 is formed in a portion of the semiconductor layer 103 separated from the substrate 101 and electrically insulated therefrom by the dielectric layer 102. Thus, the field effect transistor 114 has a semiconductor-on-insulator configuration. In some embodiments, the field effect transistor 114 may be a fully depleted field effect transistor.

The active region 123 of the field effect transistor 122 is formed in the semiconductor region 113 provided directly on the semiconductor substrate 101 without a dielectric layer between the semiconductor region 113 and the substrate 101. Thus, the field effect transistor 122 has a bulk configuration.

In some embodiments, one of the field effect transistors 114, 122, or each of the field effect transistors 114, 122 may include a gate insulation layer 119, 127 formed of a material having a greater dielectric constant than silicon dioxide and/or a gate electrode 121, 129 including one or more metals. In other embodiments, one of the field effect transistors 114, 122 or each of the field effect transistors 114, 122 may have a gate insulation layer 119, 127 including silicon dioxide and/or a gate electrode 121, 129 including polysilicon.

In some embodiments, the field effect transistor 122 may be adapted for operation at a greater supply voltage than the field effect transistor 114. The field effect transistor 122 may be adapted for receiving an input to an integrated circuit formed in the semiconductor structure 100 or for providing an output of the integrated circuit. The field effect transistor 122 may be adapted for operation at a supply voltage in a range from about 0.8-2.5 V. The field effect transistor 114 may be part of a logic circuit in the integrated circuit and may be adapted for operation at a supply voltage in a range from about 0.6-1.5 V.

Moreover, the field effect transistor 122 may have a smaller leakage current in the off-state than the field effect transistor 114.

After the formation of the field effect transistors 114, 122, further processing steps for forming an integrated circuit may be performed, which may include the formation of one or more interlayer dielectric layers and electric contacts electrically connecting the field effect transistors 114, 122 with each other and/or with other circuit elements (not shown) in the semiconductor structure 100.

Figure 2:
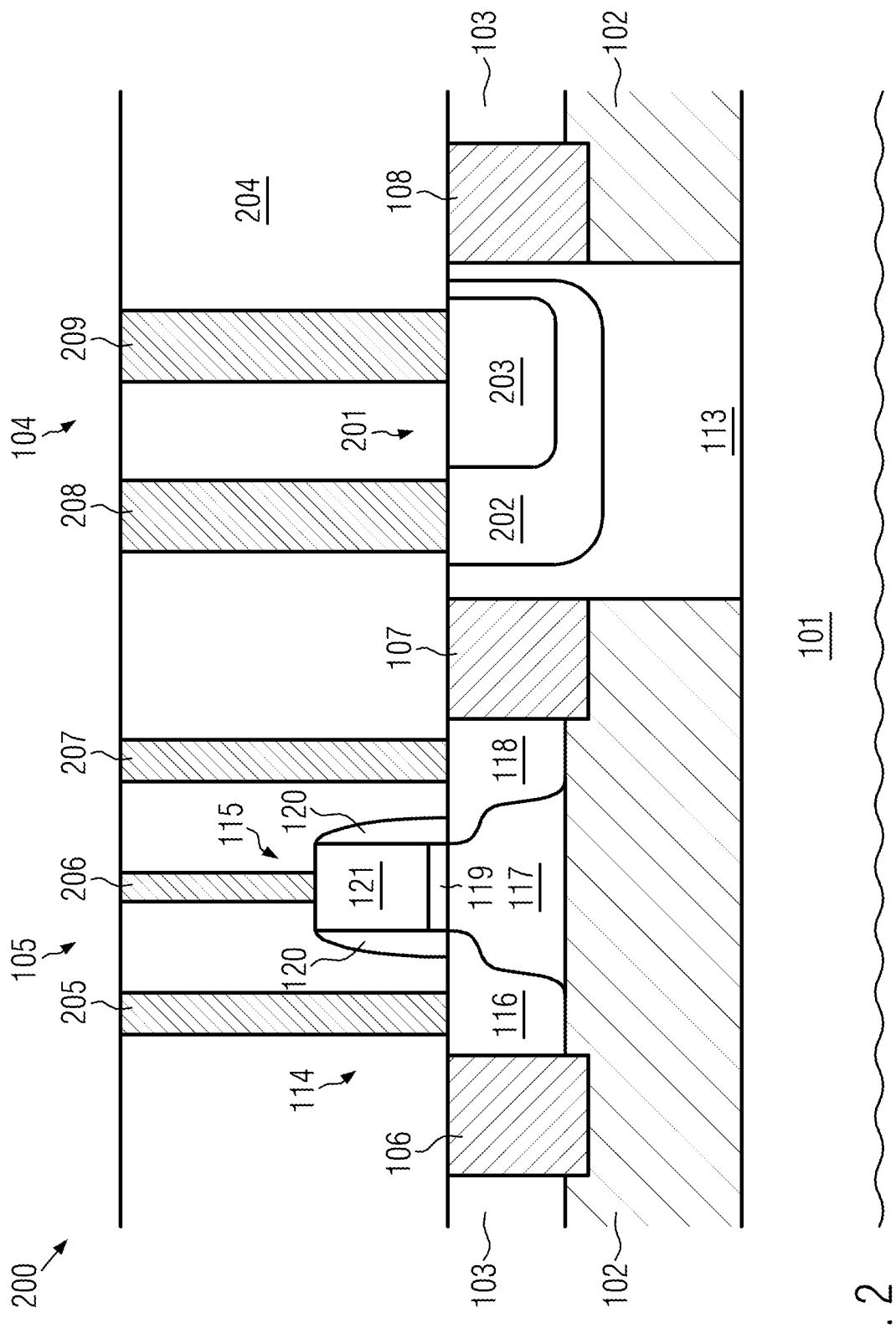
FIG. 2 shows a schematic cross-sectional view of a structure according to an illustrative embodiment.

FIG. 2 shows a schematic cross-sectional view of a semiconductor structure 200 according to an embodiment. For convenience, in FIGS. 1a-1e and 2, like reference numerals have been used to denote like components. Components shown in FIG. 2 may have features corresponding to those of components shown in FIGS. 1a-1e denoted by like reference numerals and substantially the same or similar technologies may be used for forming components denoted by like reference numerals.

The semiconductor structure 200 includes a substrate 101, a semiconductor-on-insulator region provided in a part 105 of the semiconductor structure 200, and a bulk region provided in a part 104 in the semiconductor structure 200. The part 105 of the semiconductor structure 200 includes a semiconductor region provided in the form of a semiconductor layer 103 separated from the substrate 101 and electrically insulated therefrom by a dielectric layer 102. In the part 104 of the semiconductor structure 200, a semiconductor region 113 formed directly on the semiconductor substrate 101 is provided.

In the part 105 of the semiconductor structure 200, a field effect transistor 114 is provided. The field effect transistor 114 includes a gate insulation layer 119, a gate electrode 121, a sidewall spacer 120 and an active region 115. The active region 115 includes a source region 116, a channel region 117 and a drain region 118. Trench isolation structures 106, 107, 108 provide electrical insulation between portions of the semiconductor structure 200, in particular between the semiconductor layer 103 in the part 105 and the semiconductor region 113 in the part 104 of the semiconductor structure 200.

The semiconductor region 113 includes a diode 201. The diode 201 includes doped regions 202, 203, wherein the doping of doped region 203 is inverse to the doping of doped region 202. For example, the doped region 203 may be P-doped, and the doped region 202 may be N-doped. Thus, a PN transition having rectifying properties is obtained between the doped region 202 and the doped region 203. The doped regions 202, 203 may be formed by means of techniques for doping a semiconductor material, including ion implantation and/or diffusion.

The semiconductor structure 200 further includes an interlayer dielectric 204, wherein electrical connections 205, 206, 207, 208, 209 are formed. The electrical connections 205, 206, 207 provide an electrical connection to the source region 116, the gate electrode 121 and the drain region 118 of the field effect transistor 114, respectively. The electrical connections 208, 209 provide an electrical connection to the doped region 202 and the doped region 203, respectively, of the diode 201.

The electrical connections 206-209 may be formed by forming contact vias in the interlayer dielectric 204 and filling the contact vias with a metal, for example, tungsten. The interlayer dielectric 204 may comprise silicon dioxide, and may be formed by chemical vapor deposition or plasma enhanced chemical vapor deposition.

Figure 3:
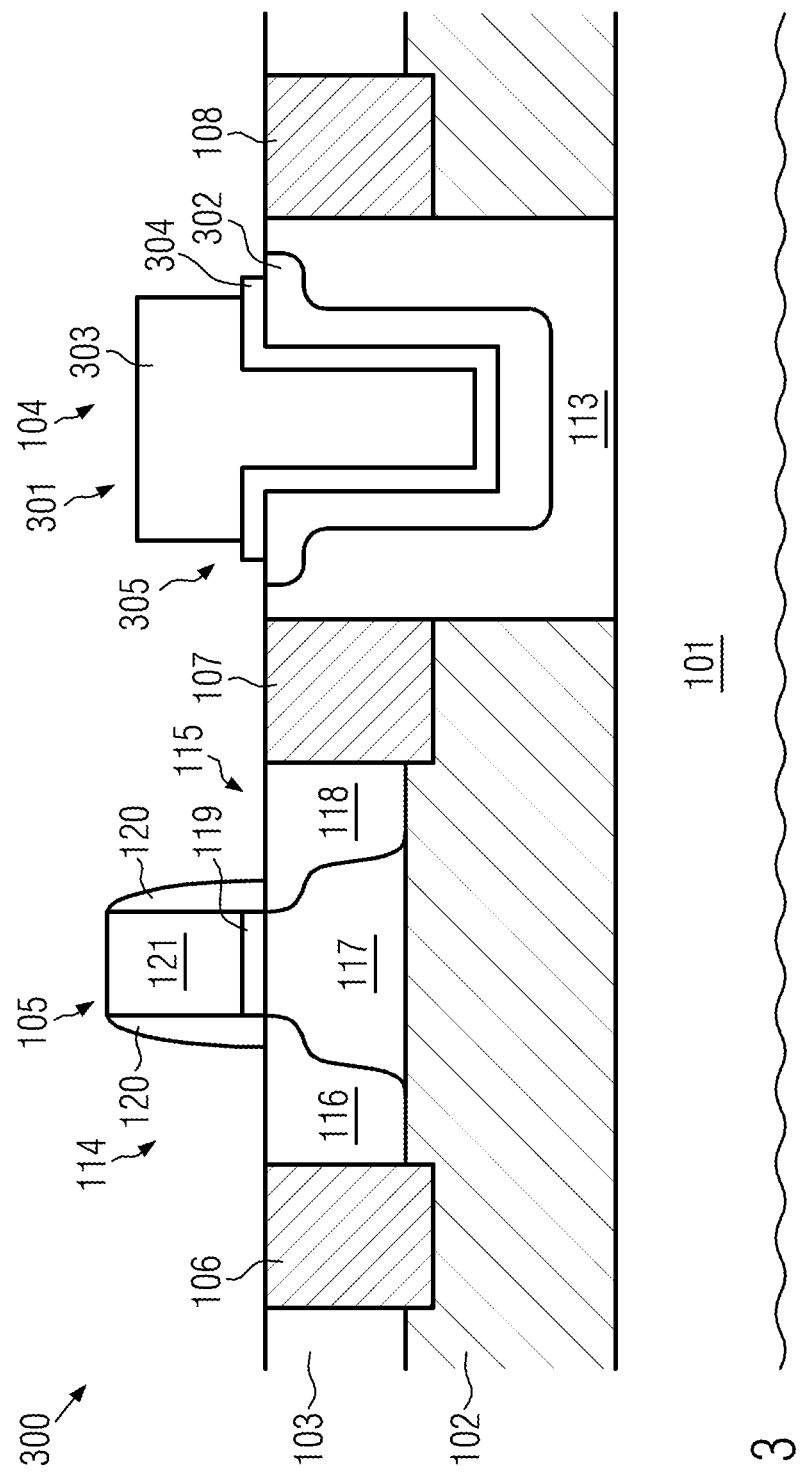
FIG. 3 shows a schematic cross-sectional view of a structure according to an illustrative embodiment.

FIG. 3 shows a schematic cross-sectional view of a semiconductor structure 300 according to an embodiment. For convenience, in FIG. 3, and in FIGS. 1a-1e and 2, like reference numerals have been used to denote like components. Components shown in FIG. 3 may have features corresponding to those of components denoted by like reference numerals in FIGS. 1a-1e and 2, and substantially the same or similar methods may be used for forming components denoted by like reference numerals.

The semiconductor structure 300 includes a substrate 101. A part 105 of the semiconductor structure 300 includes a semiconductor region provided in the form of a semiconductor layer 103 separated from the substrate 101 and electrically insulated therefrom by a dielectric layer 102.

In a part 104 of the semiconductor structure, a semiconductor region 113 is provided directly on the substrate 101. Trench isolation structures 106, 107, 108 provide electrical insulation between the semiconductor layer 103 in the part 105 of the semiconductor structure 300 and the semiconductor region 113 in the part 104 of the semiconductor structure 300, and between different portions of the semiconductor layer 103.

In the part 105 of the semiconductor structure 300, a field effect transistor 114 is provided. The field effect transistor 114 includes a gate electrode 121 separated from the semiconductor layer 103 by a gate insulation layer 119 and flanked by a sidewall spacer 120. Additionally, the field effect transistor 114 includes an active region 115 provided in the semiconductor layer 103. The active region 115 includes a source region 116, a channel region 117 and a drain region 118.

In the part 104 of the semiconductor structure 300, a capacitor 301 is formed. The capacitor 301 includes a trench 305. In the trench 305, a dielectric layer 304, which may include silicon dioxide, silicon nitride and/or another electrically insulating material, and an electrically conductive material 303, for example, doped polysilicon or a metal, are provided. A doped region 302 may be provided in the semiconductor region 113 adjacent the trench 305 for improving the electrical conductivity of the semiconductor region 113 in an area adjacent the trench 305. The doped region 302 and the electrically conductive material 303 form plates of the capacitor 301, and the dielectric layer 304 forms a dielectric of the capacitor 301.

The capacitor 301 may be formed by means of techniques including processes of photolithography and etching for forming the trench 305, ion implantation and/or diffusion processes for forming the doped region 302, and processes of deposition, photolithography and etching for forming the dielectric layer 304 and the electrically conductive material 303.

The capacitor 301 need not be a trench capacitor as shown in FIG. 3. In other embodiments, the capacitor 301 may have a substantially planar configuration, wherein the dielectric layer 304 and the electrically conductive material 303 are formed on a substantially planar portion of the semiconductor region 113.

In addition to the capacitor 301, in some embodiments, a field effect transistor (not shown) electrically connected to the capacitor 301 may be formed in the semiconductor region 113 adjacent the capacitor 301, wherein the field effect transistor and the capacitor 301 form a cell of a dynamic random access memory. Thus, a dynamic random access memory wherein dynamic random access memory cells are formed in a portion having a bulk semiconductor configuration may be provided in the same semiconductor structure as logic circuits including field effect transistors having a semiconductor-on-insulator configuration.

Figure 4A:
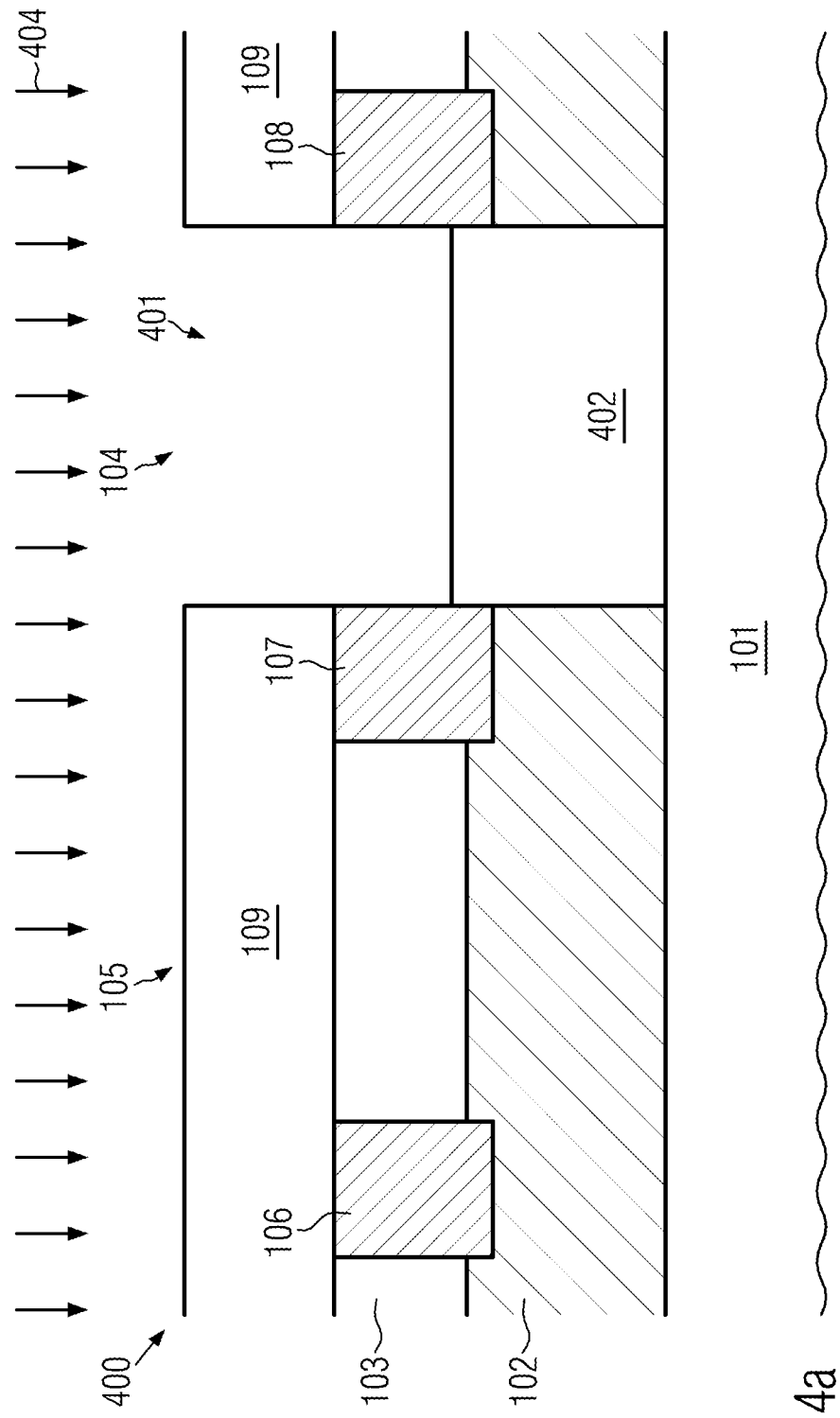
FIGS. 4a-4b show schematic cross-sectional views of a structure according to an illustrative embodiment in stages of a method according to an illustrative embodiment.
Figure 4B:
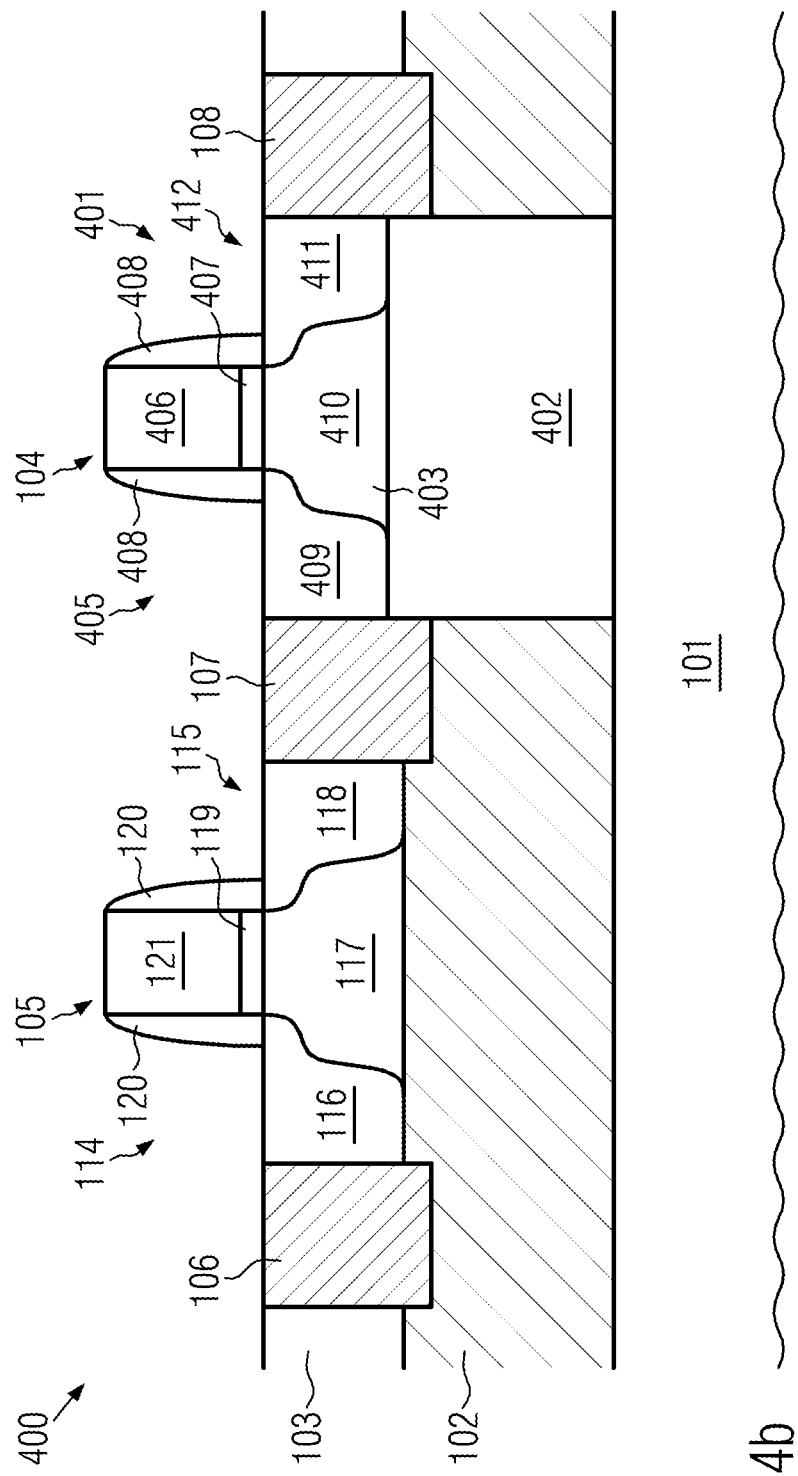

FIG. 4a shows a schematic cross-sectional view of a semiconductor structure 400 in a stage of a manufacturing process. A schematic cross-sectional view of the semiconductor structure 400 in a later stage of the manufacturing process is shown in FIG. 4b. For convenience, in FIGS. 4a-4b, and in FIGS. 1a-1e, 2 and 3, like reference numerals have been used to denote like components. Features of components shown in FIGS. 4a-4b may correspond to features of components shown in FIGS. 1a-1e, 2 and 3 denoted by like reference numerals, and substantially identical or similar methods may be used for forming the components.

The semiconductor structure 400 includes a semiconductor substrate 101. In a part 105 of the semiconductor structure 400, a semiconductor region provided in the form of a semiconductor layer 103 and a dielectric layer 102 are provided above the substrate 101. The dielectric layer 102 separates the semiconductor layer 103 from the substrate 101 and provides electrical insulation between the semiconductor layer 103 and the substrate 101. Additionally, the semiconductor structure 400 includes trench isolation structures 106, 107, 108 and a mask 109 covering the part 105 of the semiconductor structure 400. In a part 104 of the semiconductor structure 400 that is not covered by the mask 109, the semiconductor layer 103 and the dielectric layer 102 have been removed.

The semiconductor structure 400, with the semiconductor layer 103 and the dielectric layer 102 removed in part 104 of the semiconductor structure 400, may be obtained by methods as described above with reference to FIGS. 1a-1b. In particular, etch processes may be performed for removing portions of the semiconductor layer 103 and the dielectric layer 102 in the part 104 of the semiconductor structure 400 and for exposing the substrate 101 in the part 104 of the semiconductor structure 400.

A growth process denoted by arrows 404 in FIG. 4a is performed to form a first portion 402 of a semiconductor region 401 in the part 104 of the semiconductor structure 400. The growth process 404 may be a selective epitaxial growth process adapted for selectively depositing the material of the first portion 402 of the semiconductor region 401 on the semiconductor material of the substrate 101, wherein substantially no material is deposited on the mask 109 or only a small amount of material is deposited on the mask 109.

In some embodiments, the first portion 402 of the semiconductor region 401 may include the same semiconductor material as the semiconductor substrate 101. In some of these embodiments, both the semiconductor substrate 101 and the first portion 402 of the semiconductor region 401 may include silicon. A chemical vapor deposition process or a plasma enhanced chemical vapor deposition process, as described above with reference to FIG. 1c, may be performed for selectively depositing the material of the first portion 402 of the semiconductor region 401 on the substrate 101.

In other embodiments, the substrate 101 and the first portion 402 of the semiconductor region 401 may include a semiconductor material other than silicon and/or the first portion 402 of the semiconductor region 401 may include a material different from the material of the substrate 101.

Methods of selective epitaxial growth such as molecular beam epitaxy or metal organic chemical vapor deposition processes may be used as alternatives to chemical vapor deposition and plasma enhanced chemical vapor deposition for forming the first portion 402 of the semiconductor region 401, as described above.

The growth process 404 is stopped before the first portion 402 of the semiconductor region 401 extends up to the level of the interface between the semiconductor layer 103 and the mask 109, so that the semiconductor layer 103 includes portions that are located at a greater distance to the substrate 101 than the surface of the first portion 402 of the semiconductor region 401 that is obtained when the growth process 404 is stopped. Thus, the part 104 of the semiconductor structure 400 includes a recess between the trench isolation structures 107, 108, wherein the first portion 402 of the semiconductor region 401 is provided at the bottom of the recess.

Similar to the semiconductor region 113 described above, the first portion 402 of the semiconductor region 401 is formed directly on the substrate 101, wherein there is no dielectric layer between the first portion 402 of the semiconductor region 401 and the substrate 101.

FIG. 4b shows a schematic cross-sectional view of the semiconductor structure 400 in a later stage of the manufacturing process. After the formation of the first portion 402 of the semiconductor region 401, a second portion 403 of the semiconductor region 401 is formed. The second portion 403 of the semiconductor region 401 includes a different material than the first portion 402. In some embodiments, the first portion 402 may include silicon, and the second portion 403 may include silicon/germanium, silicon carbide, germanium or a III-V semiconductor material such as, for example, gallium arsenide.

The second portion 403 of the semiconductor region 401 may be formed by means of a selective epitaxial growth process adapted to selectively deposit the material of the second portion 403 of the semiconductor region 401 on the material of the first portion 402 of the semiconductor region 401, whereas no material or only a small amount of material is deposited on the mask 109 (FIG. 4a).

In embodiments wherein the first portion 402 of the semiconductor region 401 includes silicon and the second portion 403 includes silicon/germanium, germane ($GeH_4$) may additionally be supplied during a chemical vapor deposition or plasma enhanced chemical vapor deposition process similar to that described above in the context of the formation of the semiconductor region 113 in the embodiments of FIGS. 1a-1e. Thus, germanium may be included into the second portion 403 of the semiconductor region 401, in addition to silicon, so that silicon/germanium is obtained.

In embodiments wherein the second portion 403 of the semiconductor region 401 includes a III-V semiconductor material, such as gallium arsenide, molecular beam epitaxy or a metal organic chemical vapor deposition process may be employed for selectively growing the material of the second portion 403 of the semiconductor region 401 on the material of the first portion 402.

In further embodiments, the second portion 403 of the semiconductor region 401 may be formed by means of a non-selective growth process, wherein the material of the second portion 403 of the semiconductor region 401 is deposited not only on the first portion 402 but also on the mask 109 (FIG. 4a).

After the formation of the second portion 403 of the semiconductor region 401, the mask 109 and any semiconductor material deposited on the mask 109 may be removed by means of an etch process and/or a polishing process, such as chemical mechanical polishing, as described above with reference to FIG. 1e.

After the etch process and/or the polishing process, the semiconductor structure 400 may have a smooth surface, wherein a surface of the second portion 403 of the semiconductor region 401 in the part 104 of the semiconductor structure 400 and a surface of the semiconductor layer 103 in the part 105 of the semiconductor structure 400 substantially lie in the same plane.

A field effect transistor 114 is formed in the part 105 of the semiconductor structure 400. The field effect transistor 114 includes a gate electrode 121, a gate insulation layer 119, a sidewall spacer 120 and an active region 115 formed in the semiconductor layer 103. The active region 115 includes a source region 116, a channel region 117 and a drain region 118.

In the part 104 of the semiconductor structure 400, a field effect transistor 405 may be formed. The field effect transistor 405 includes a gate electrode 406 formed above the second portion 403 of the semiconductor region 401 and separated therefrom by a gate insulation layer 407. A sidewall spacer 408 is formed adjacent the gate electrode 406. The field effect transistor 405 further includes an active region 412 formed in the second portion 403 of the semiconductor region 401. The active region 412 includes a source region 409 and a drain region 411, which are located adjacent a channel region 410 located below the gate electrode 406.

The field effect transistor 405 may be formed by means of techniques for forming a field effect transistor including deposition, oxidation, photolithography and ion implantation, similar to transistor 122 described above with reference to FIG. 1e.

The field effect transistor 405 in the part 104 of the semiconductor structure 400 has a bulk configuration, similar to the field effect transistor 122 described above with reference to FIG. 1e. Moreover, since the active region 412 of the field effect transistor 405 is provided in the second portion 403 of the semiconductor region 401, a number of semiconductor materials other than silicon may be employed for the active region 412.

For example, the active region 412 may be formed in silicon/germanium, silicon carbide or germanium which, when deposited on a first portion 402 of the semiconductor region 401 including silicon may have an intrinsic strain that allows improving the mobility of charge carriers in the channel region 410.

In other embodiments, the active region 412 may be formed in a III-V semiconductor material, such as gallium arsenide, which may have a substantially greater mobility of charge carriers than silicon.

Figure 5A:
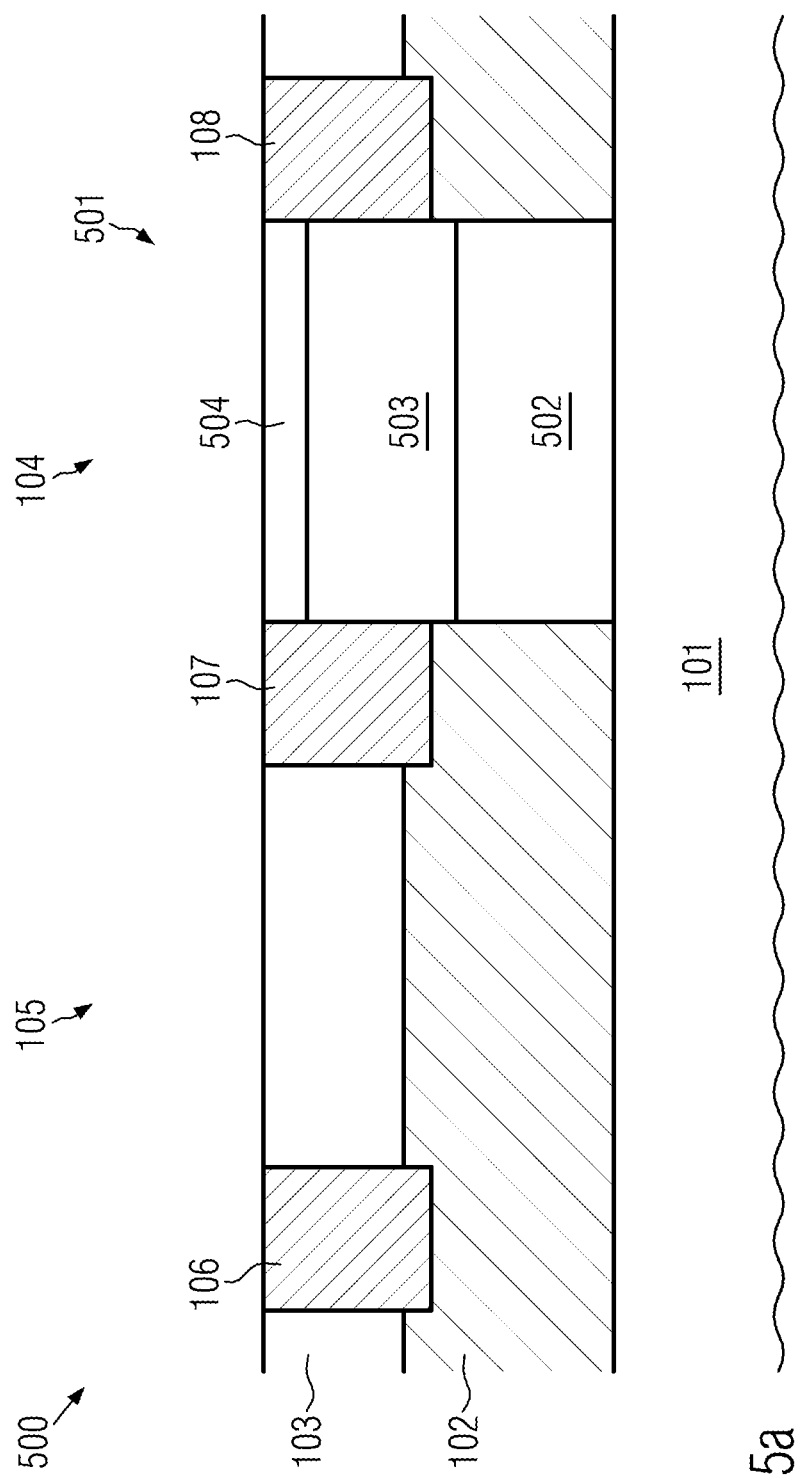
FIGS. 5a-5b show schematic cross-sectional views of a structure according to an illustrative embodiment in stages of a method according to an illustrative embodiment.
Figure 5B:
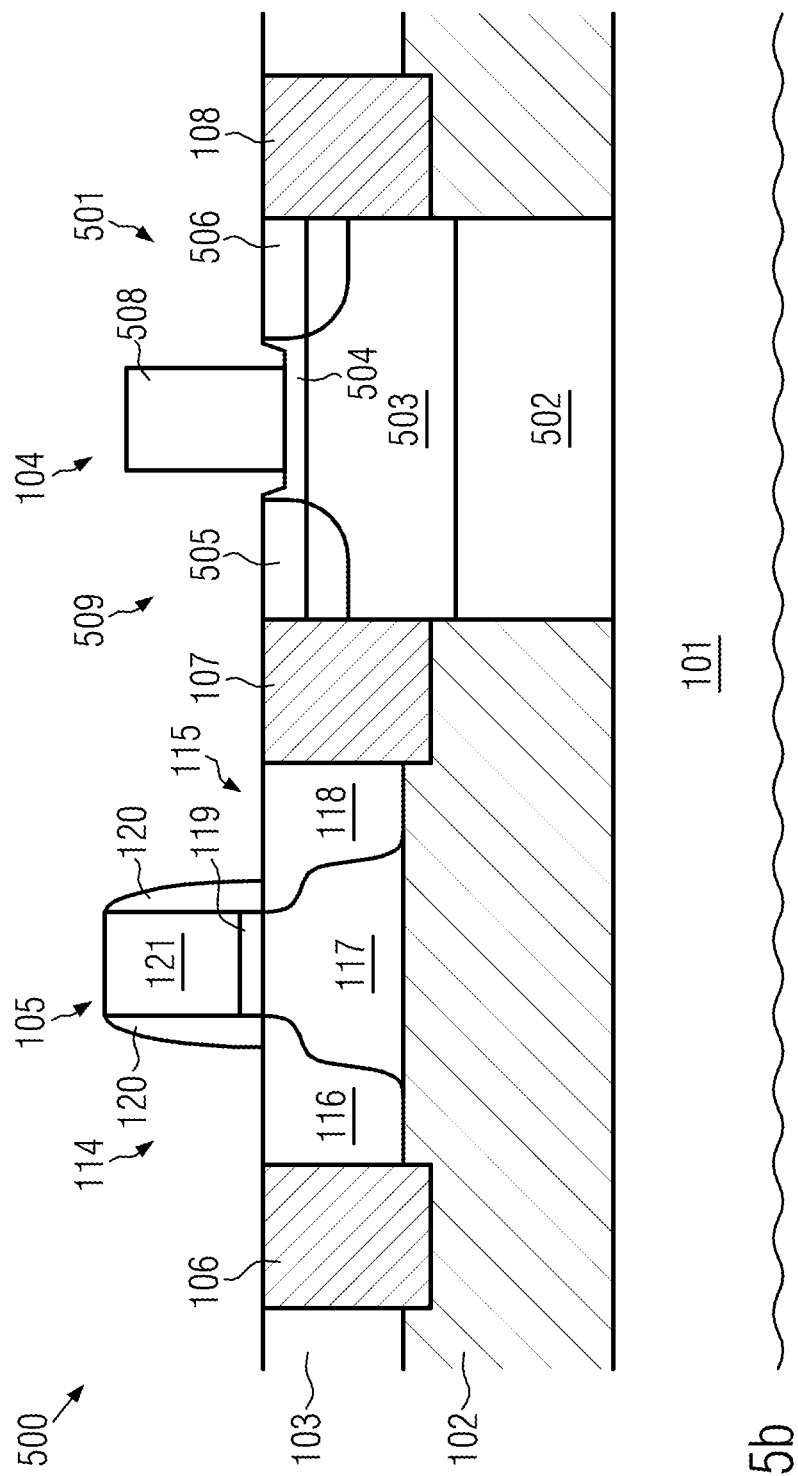

FIG. 5a shows a schematic cross-sectional view of a semiconductor structure 500 in a stage of a method of manufacturing a semiconductor structure according to an embodiment. A schematic cross-sectional view of the semiconductor structure 500 in a later stage of the manufacturing process is shown in FIG. 5b. For convenience, in FIGS. 5a-5b, and in FIGS. 1a-1e, 2, 3 and 4a-4b, like reference numerals have been used to denote like components. Components shown in FIGS. 5a-5b may have features corresponding to those of components denoted by like reference numerals in FIGS. 1a-1e, 2, 3 and 4a-4b, and substantially identical or similar methods may be used for forming components denoted by like reference numerals.

The semiconductor structure 500 as shown in FIG. 5a includes a semiconductor substrate 101. A part 105 of the semiconductor structure 500 includes a semiconductor region provided in the form of a semiconductor layer 103 and a dielectric layer 102. The dielectric layer 102 is provided between the semiconductor layer 103 and the semiconductor substrate 101, and provides electrical insulation between the semiconductor layer 103 and the substrate 101. Thus, the semiconductor layer 103 and the dielectric layer 102 provide a semiconductor-on-insulator region in the semiconductor structure 500. The semiconductor structure 500 further includes trench isolation structures 106, 107, 108 that provide electrical insulation between portions of the semiconductor layer 103 and between the parts 104, 105 of the semiconductor structure 500.

The part 104 of the semiconductor structure 500 includes a semiconductor region 501 that is provided directly on the substrate 101, wherein there is no dielectric layer between the semiconductor region 501 and the substrate 101. Semiconductor region 501 includes a first portion 502 that is provided directly on the substrate 101, a second portion 503 on the first portion 502 and a third portion 504 on the second portion 503. The semiconductor region 501 in the part 104 of the semiconductor structure 500 provides a bulk region.

The third portion 504 of the semiconductor region 501 may have a surface lying in substantially the same plane as a surface of the semiconductor layer 103 in the part 105 of the semiconductor structure 500.

The portions 502, 503, 504 of the semiconductor region 501 may include different semiconductor materials. In some embodiments, the first portion 502 may include substantially the same semiconductor material as the substrate 101. For example, the substrate 101 and the first portion 502 of the semiconductor region 501 may include silicon. The second portion 503 of the semiconductor region 501 may include a semiconductor material that is different from the semiconductor material of the first portion 502, and the third portion 504 may include a semiconductor material that is different from the materials of the first portion 502 and the second portion 503.

In some embodiments, the first portion 502 of the semiconductor region 501 includes silicon, the second portion 503 may include substantially undoped gallium arsenide, and the third portion 504 may include N-doped aluminum gallium arsenide.

The semiconductor structure 500 as shown in FIG. 5a may be formed by means of methods as described above with reference to FIGS. 1a-1d and 4a-4b. In particular, a mask similar to the mask 109 described above may be formed over the part 105 of the semiconductor structure 500, an etch process may be performed for removing the semiconductor layer 103 and the dielectric layer 102 in the part 104 of the semiconductor structure 500, and a plurality of growth processes, for example, selective epitaxial growth processes, may be performed for forming the portions 502, 503, 504 of the semiconductor region 501. Thereafter, the mask may be removed by means of an etch process and/or a polishing process, for example, a chemical mechanical polishing process, and a substantially smooth and planar surface of the semiconductor structure 500 may be provided.

FIG. 5*b* shows a schematic cross-sectional view of the semiconductor structure 500 in a later stage of the manufacturing process. In the part 105 of the semiconductor structure 500, a field effect transistor 114 may be formed. The field effect transistor 114 includes a gate electrode 121 separated from the semiconductor layer 103 by a gate insulation layer 119 and flanked by sidewall spacers 120. In the semiconductor layer 103, an active region 115 of the field effect transistor 114 is provided. The active region 115 includes a source region 116, a channel region 117 below the gate electrode 121 and a drain region 118.

In the part 104 of the semiconductor structure 500, a high electron mobility transistor 509 may be formed. The high electron mobility transistor 509 may include a source region 505 and a drain region 506. The source region 505 and the drain region 506 may be N-doped, and may have a greater dopant concentration than other portions of the third portion 503 of the semiconductor region 501. Ion implantation processes may be performed for forming the source region 505 and the drain region 506. The high electron mobility transistor 509 further includes a gate electrode 508, which may be a metal gate electrode that is formed in a recess of the third portion 504 of the semiconductor region 501. The recess and the gate electrode 508 may be formed by means of known techniques of photolithography, etching and deposition.

Hence, the semiconductor structure 500 includes a field effect transistor 114, which has a solid-on-solid configuration, and a high electron mobility transistor 509, which are provided on the same substrate 101.

The present disclosure is not limited to embodiments wherein the bulk region includes a single circuit element, such as a field effect transistor, or a relatively small number of circuit elements, such as a single dynamic random access memory cell. In further embodiments, a semiconductor structure includes a semiconductor-on-insulator region wherein a circuit including a relatively large number of circuit elements is formed, and a bulk region, wherein another circuit including a relatively large number of circuit elements is formed. In the following, such embodiments will be described with reference to FIG. 6.

Figure 6:
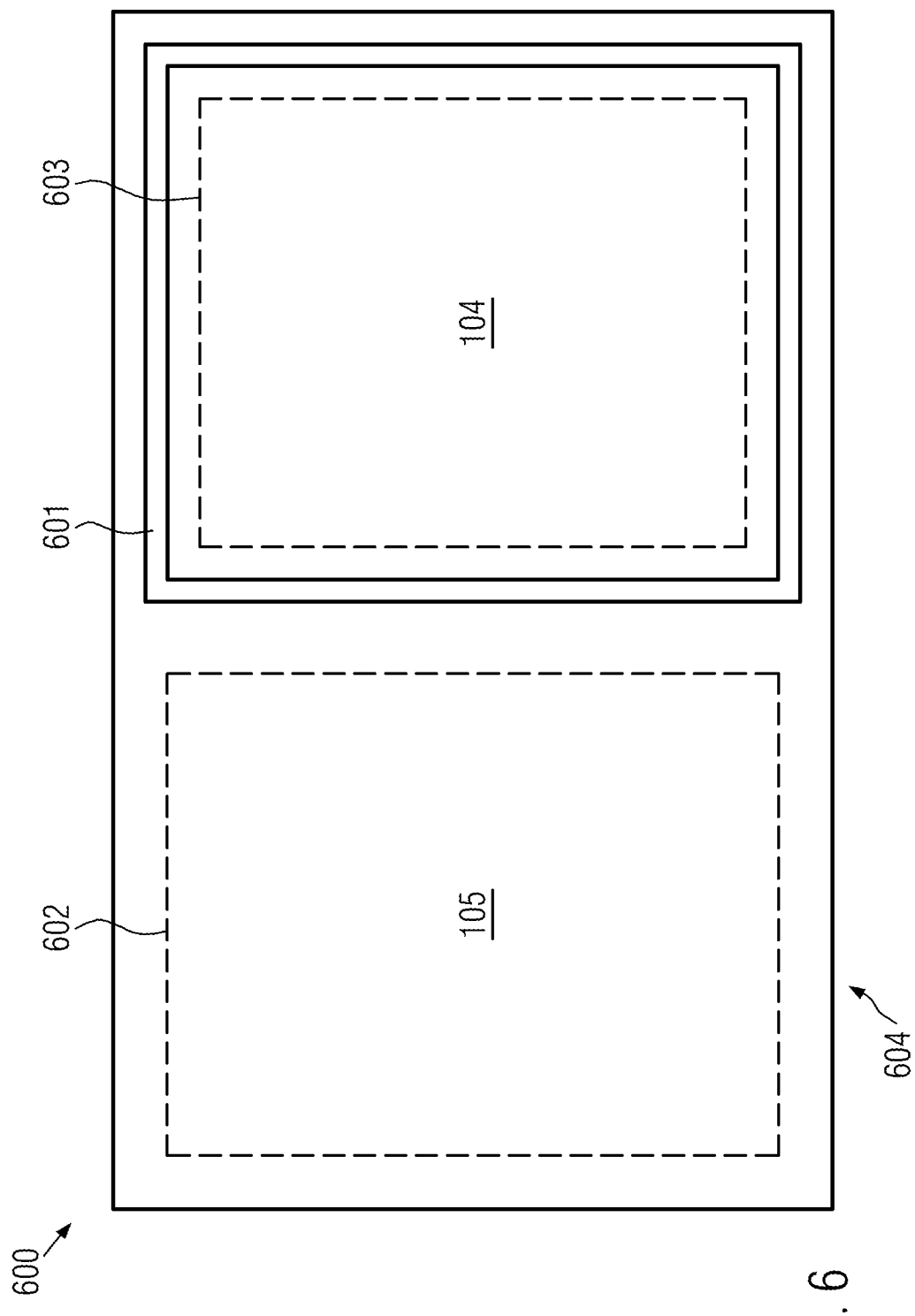
FIG. 6 shows a schematic top view of a structure according to an illustrative embodiment.

FIG. 6 shows a schematic top view of a semiconductor structure 600 according to an embodiment. For convenience, in FIG. 6, and in FIGS. 1*a*-5*b*, like reference numerals have been used to denote like components, and components shown in FIG. 6 may have features corresponding to those of components shown in FIGS. 1*a*-5*b* denoted by like reference numerals.

The semiconductor structure 600 may be a semiconductor chip. The semiconductor structure 600 includes parts 104, 105. Part 105 may be a semiconductor-on-insulator region, wherein a semiconductor region that may be provided in form of a layer of a semiconductor material similar to the semiconductor layer 103 described above is provided above a semiconductor substrate similar to substrate 101, and a dielectric layer similar to dielectric layer 102 is provided between the semiconductor layer and the substrate.

The part 104 of the semiconductor structure 600 may be a bulk region including a semiconductor region provided directly on the semiconductor substrate. The semiconductor region may have features corresponding to those of any of the semiconductor regions 113, 401 and 501 described above with reference to FIGS. 1*a*-5*b*. A trench isolation structure 601 separates the parts 104, 105 of the semiconductor structure 600 from each other and provides electric insulation between the parts 104, 105.

The semiconductor structure 600 further includes an integrated circuit 604. The integrated circuit 604 includes a first circuit 602 formed in the part 105 of the semiconductor structure 600, and a second circuit 603 formed in the part 104 of the semiconductor structure 600. The semiconductor structure 600 may further include electrical connections (not shown) between the first circuit 602 and the second circuit 603 which may be provided in the form of electrically conductive lines formed in or on an interlayer dielectric that is provided above the semiconductor-on-insulator region in part 105 and the bulk region in part 104 of the semiconductor structure 600.

Since the first circuit 602 is formed in part 105 of the semiconductor structure 600, the first circuit may include circuit elements such as field effect transistors having a semiconductor-on-insulator configuration, for example, fully depleted field effect transistors. Since the second circuit 603 is formed in part 104 of the semiconductor structure 600 that includes a bulk region, circuit elements having a bulk semiconductor configuration may be provided. Moreover, in some embodiments, circuit elements in the first circuit 602 and circuit elements in the second circuit 603 may be formed of different semiconductor materials.

In some embodiments, the first circuit 602 may include a digital logic circuit, and the second circuit 603 may include a high frequency analog circuit. In such embodiments, the semiconductor region in the part 104 of the semiconductor structure 600 may include a III-V semiconductor material such as gallium arsenide. The semiconductor layer in the part 105 of the semiconductor structure 600 may include silicon.

In some embodiments, the high frequency analog circuit 603 may include a transmitter and/or a receiver for electromagnetic radiation, such as microwave radiation. Thus, the semiconductor structure 600 may be adapted both for transmitting and/or receiving electromagnetic radiation and for processing information, wherein the sending and/or receiving may be performed by the second circuit 603, and the processing of the transmitted information may be performed by the first circuit 602.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a structure comprising a semiconductor substrate, a semiconductor layer provided above said semiconductor substrate and a dielectric layer provided between said semiconductor substrate and said semiconductor layer;
   forming a trench isolation region, providing electrical isolation between a portion of said semiconductor layer in a second part of said structure and a first part of said structure, before said portions of said semiconductor layer and said dielectric layer in said first part of said structure are removed;
   after forming said trench isolation region, removing portions of said semiconductor layer and said dielectric layer in said first part of said structure so that said semiconductor substrate is exposed in said first part of said structure, wherein portions of said dielectric layer and said semiconductor layer in said second part of said structure remain on said semiconductor substrate;

forming a semiconductor region directly on the exposed semiconductor substrate in said first part of said structure; and forming a first transistor in said second part of said structure, said first transistor comprising an active region provided in said portion of said semiconductor layer in said second part of said structure.

2. The method of claim 1, wherein the formation of said semiconductor region comprises performing at least one selective growth process selectively depositing at least one semiconductor material in said first part of said structure.

3. The method of claim 1, further comprising forming a second transistor in said first part of said structure, said second transistor comprising an active region provided in said semiconductor region.

4. The method of claim 3, wherein said second transistor is adapted for operation at a greater supply voltage than said first transistor.

5. The method of claim 1, further comprising forming at least one of a diode and a capacitor in said first part of said structure.

6. The method of claim 1, wherein said first transistor is a fully depleted field effect transistor.

7. The method of claim 1, wherein the formation of said semiconductor region comprises:

performing a first selective growth process depositing a first semiconductor material directly on said exposed semiconductor substrate in said first part of said structure, said first semiconductor material comprising a same material as said semiconductor substrate; and after said first selective growth process, performing at least one second selective growth process depositing at least one second semiconductor material comprising a different material than said semiconductor substrate.

8. The method of claim 7, wherein said semiconductor substrate comprises silicon and said second semiconductor material comprises at least one of silicon/germanium, germanium and one or more III-V semiconductor materials.

9. The method of claim 7, further comprising forming a high electron mobility transistor in said first part of said structure.

10. The method of claim 7, further comprising forming a digital logic circuit, at least a part of said digital logic circuit being formed in said second part of said structure, and forming a high frequency analog circuit, at least a part of said high frequency analog circuit being formed in said first part of said structure.

* * * * *